(12) United States Patent
Flood et al.

(10) Patent No.: US 6,172,777 B1
(45) Date of Patent: Jan. 9, 2001

(54) OPTICAL INTERCONNECTION FOR HOLOGRAPHIC MEMORIES AND METHOD FOR USING THE SAME

(75) Inventors: Kevin M. Flood, Exton; David C. Driscoll, West Chester, both of PA (US)

(73) Assignee: LSA, Inc., Arlington, VA (US)

( * ) Notice: Under 35 U.S.C. 154(b), the term of this patent shall be extended for 0 days.

(21) Appl. No.: 09/159,471

(22) Filed: Sep. 23, 1998

Related U.S. Application Data (60) Provisional application No. 60/059,631, filed on Sep. 23, 1997.

(51) Int. Cl.$^7$ ............................................. G03H 1/10
(52) U.S. Cl. .................. 359/10; 359/22; 359/32
(58) Field of Search ................ 359/10, 11, 21, 359/22, 24, 32

(56) References Cited

U.S. PATENT DOCUMENTS

| | | |
|---|---|---|
| 4,860,253 | 8/1989 | Owechko . |
| 5,126,869 | 6/1992 | Lipchak . |
| 5,132,811 | 7/1992 | Iwaki . |
| 5,216,527 * | 6/1993 | Sharnoff et al. .............. 359/24 |
| 5,436,867 | 7/1995 | Mok . |
| 5,438,439 * | 8/1995 | Mok et al. .................. 359/10 |
| 5,483,365 | 1/1996 | Pu . |
| 5,519,651 | 5/1996 | Redfield . |
| 5,550,779 | 8/1996 | Burr . |
| 5,638,193 | 6/1997 | Trisadi . |
| 5,661,577 | 8/1997 | Jenkins . |
| 5,671,073 | 9/1997 | Psaltis . |

* cited by examiner

*Primary Examiner*—Darren Schuberg
(74) *Attorney, Agent, or Firm*—Reed Smith Hazel & Thomas LLP (57) ABSTRACT

An optical interface of a holographic memory system electrically selects one of several optical pathways to store or retrieve an image from a holographic memory by activating liquid crystal polarization rotators and novel liquid crystal gratings. In a preferred embodiment a spatial light modulator, a pixelized readout device (i.e., focal-plane array), a series of polarizing optical components, liquid-crystal polarization rotators, liquid-crystal beam-steering devices, and interconnecting and imaging optics are provided. The parallel interconnection accepts a laser-beam input, divides the beam among multiple paths, imparts a data-bearing spatial signature on a signal beam by means of a spatial light modulator, steers a reference beam by means of liquid-crystal beam-steering devices, and directs the appropriate beams into the recording medium. The interconnection functions are realized within a solid-optical assembly requiring no air-glass interfaces, and the beam-steering functions for the reference beam are accomplished by non-mechanical means using liquid-crystal devices.

11 Claims, 8 Drawing Sheets

OPTICAL INTERCONNECTION FOR HOLOGRAPHIC MEMORIES AND METHOD FOR USING THE SAME

This application claims the benefit of U.S. Provisional Patent Application Ser. No. 60/059,631 filed Sep. 23, 1997, titled "Integrated Parallel Optical Interconnections for Holographic Memories."

This invention was made with Government support under contract F30602-97-C-0057 awarded by the United States Air Force. The Government has certain rights in the invention. The U.S. Government has a paid-up license in this invention and the right in limited circumstances to require the patent owner to license others on reasonable terms as provided by the terms of F30602-97-C-0057 awarded by the United States Air Force.

FIELD OF THE INVENTION

The present invention relates generally to apparatus and methods for optically interconnecting holographic memory storage devices so that multiplexing can be accomplished by non-mechanical methods.

BACKGROUND OF THE INVENTION

Figure 1:
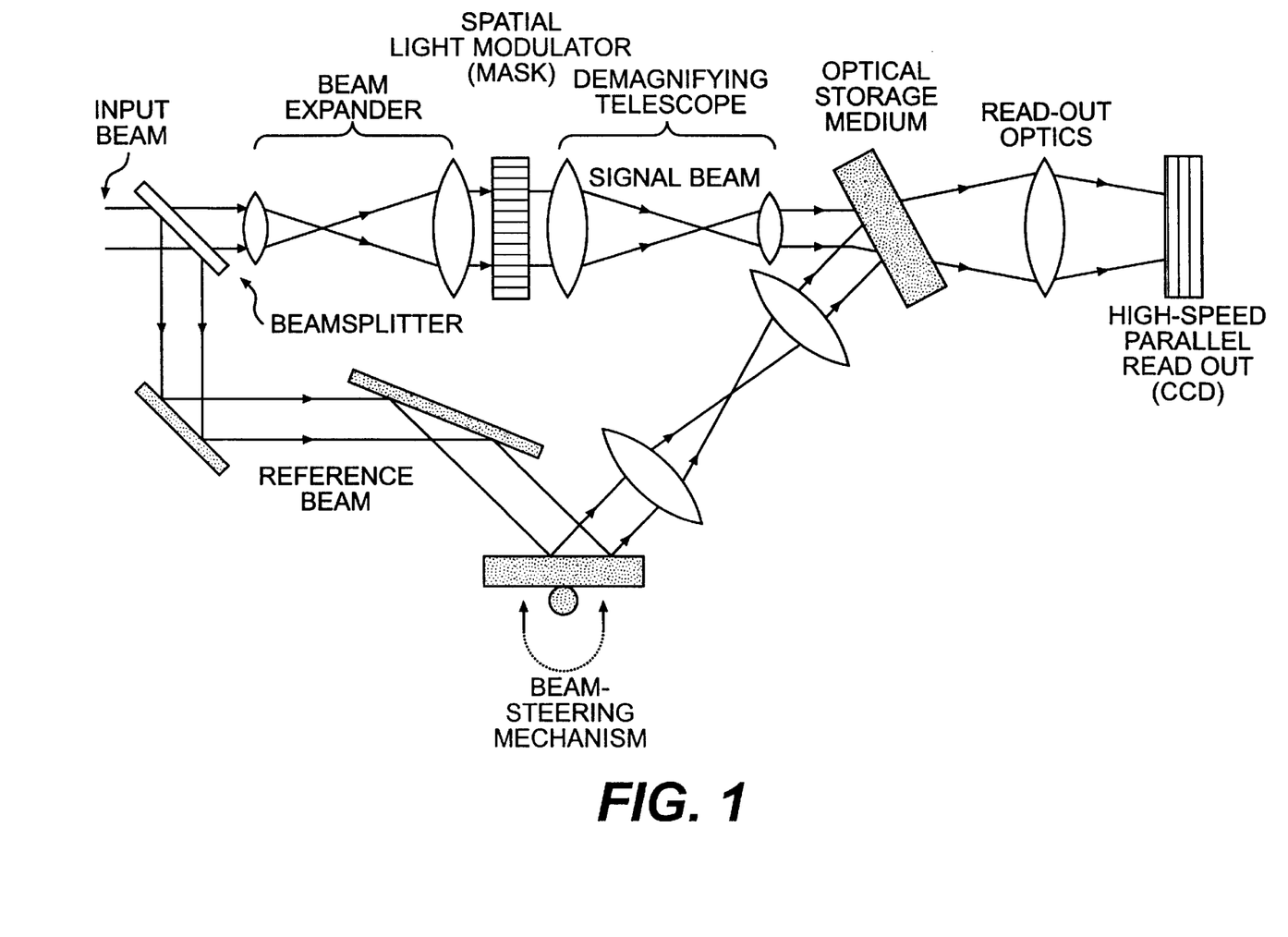
FIG. 1 is a schematic diagram illustrating a conventional recording and playback interface design for a volume hologram.

The leading 3-D optical memory technology is holographic data storage. FIG. 1 illustrates a typical holographic memory apparatus for recording data in a 3-D holographic memory, of the type disclosed generally by VanHeerden in "Theory of Optical Information Storage in Solids," Appl. Opt. 2, 393–400 (1963), and von der Linde et al., "Photorefractive effects for Reversible Holographic Storage of Information," Appl. Phys. 8, 85–100 (1975). As illustrated in FIG. 1, the information to be stored is represented in a binary format on a two-dimensional spatial light modulator (SLM). The SLM may be transmissive, as illustrated in FIG. 1, or reflective. To achieve the high coherence required of the image beam and the reference beam, a common laser beam is split into two paths. Light from one path illuminates the SLM while light in the other path becomes a reference beam. The reference beam path is directed at an appropriate angle to achieve a high diffraction efficiency in the volume holographic material. The use of image and reference beam is manner described by Kogelnik in "Coupled Wave Theory for Thick Hologram ratings," Bell System Technical Journal 48, 2909–2947 (1969). The two beams are directed in such a way that they intersect within the recording medium. Because the beams are coherent with respect to each other, an interference pattern is created. The interference pattern is recorded in the holographic medium.

The interference pattern has a unique spatial frequency content that is determined by the properties of the SLM, the SLM pattern, and the angle between the reference and signal paths. By changing the reference beam angle, another holographic pattern can be stored in the same physical location without destroying the data from previously recorded patterns. This process is referred to as angle multiplexing, and is possible as the spatial frequency properties of successive recordings are substantially different (due to the different reference beam angles) so that each SLM pattern can be individually recovered. The SLM pattern may be recovered by illuminating the recording medium with a reference beam whose angle corresponds to the reference beam angle used during recording. The optical memory output, which is imaged onto an electro-optical readout device (e.g. a solid state camera) is a recreation of the SLM data presented to the system during recording. Additional data can be recorded if the recording medium is mechanically rotated around an axis perpendicular to its surface, in a process known as peristrophic multiplexing. Peristrophic multiplexing is described by Curtis et al., "Method for Holographic Storage Using Peristrophic Multiplexing," Opt. Lett. 19, 993–995 (1994), and in U.S. Pat. No. 5,483,365 to Curtis et al.

Holographic memories technology has been under theoretical development for some time, as described in "Experimental Holographic Read-Write Memory Using 3-D Storage" by d'Aurie et al., Appl. Opt. 13, 808–818 (1974). Holographic memories have theoretical capacities on the order of $10^{12}$ bits/cm$^3$ and parallel, page-oriented readout, which provides a convenient interface for storage of images and other page-oriented data. Access times in systems using parallel writing and reading are potentially much faster than access times achieved in systems using bit-oriented 3-D storage, as noted by Strickler et al. in "Three Dimensional Optical data storage in refractive media by two-photon point excitation," Opt. Lett 16, 1780–1782 (1991).

However, in practice, maximum theoretical capacities and response speeds have not been realized and holographic memories have not achieved widespread commercial acceptance. Through their research, the inventors have noted that systems of the type shown in FIG. 1 require the integration of a number of optical components with separate optomechanical mountings, alignment requirements, and air-glass interfaces. The implementation of angle multiplexing is generally accomplished using an electromechanical mechanism such as a scanning mirror, and peristrophic multiplexing requires a means by which the recording medium can be rotated. The inventors have found that numerous design features of these systems, including the noted optical interfacing techniques and mechanical scanning components, limit the achievable bandwidth, access time, and storage density of these systems.

U.S. Pat. No. 5,671,073 to Psaltis et al. discloses a holographic memory storage device of this type, including a mechanical beam steering assembly for peristrophic and angular multiplexing of an optical recording medium. U.S. Pat. No. 5,436,867 to Mok shows a holographic random access memory with an optical mechanism for angular multiplexing, but the system shown in Mok does not provide an integrated non-mechanical system for peristrophic multiplexing.

U.S. Pat. Nos. 4,860,253 to Owechko et al., 5,126,869 to Lipchak et al., 5,132,811 to Iwaki et al., 5,519,651 to Redfield., 5,661,577 to Jenkins et al., 5,671,073 to Psaltis et al., 5,483,365 to Pu et al., 5,550,779 to Burr et al., and 5,638,193 to Trisnadi et al. show other holographic memory storage devices and methods from the prior art. Systems falling into the general categories shown in these patents share the performance limitations described above.

The concept of a liquid crystal grating has been suggested in the scientific community (see, for example, W. P. Parker, "Commercial Applications of Diffractive Switched Optical Elements (SOE's)," Proceedings of the SPIE 2689, 195–209 (1996)) but such devices are not widely available.

Therefore, the inventors have determined that there is a need for improved systems and methods which can be applied to holographic memory storage interfaces.

SUMMARY OF THE INVENTION

Therefore, it is a general object of the present invention to provide a novel and improved interface mechanism for holographic memory storage devices which combines optical functions in a solid optical assembly, eliminating imaging and relay optics for the recording functions, and implementing peristrophic multiplexing using an optical interface.

Another general object of the invention is to provide a beam steering interface apparatus for a holographic memory device incorporating a novel liquid crystal grating structure.

Another object of the invention is to provide an improved interface method which uses multiple predetermined paths for a reference beam to implement peristrophic multiplexing.

It is also an object of the invention to provide an improved integrated assembly for a holographic memory storage device which minimizes the size and alignment sensitivity of the integrated assembly and which can be easily manufactured.

Another object of the invention is to provide a holographic memory system and associated interface structures and methods which substantially improve performance characteristics of the holographic memory system compared to prior art efforts, achieving storage capacities in excess of 2.5 gigabytes per location, bandwidth in excess of 1 gigabyte per second, and access times faster than 100 microseconds.

Another object of the invention is to provide a unique liquid crystal grating and manufacturing method for making the same.

These objects, and others which will be apparent to those skilled in the art upon review of the written specification, drawings, and claims, are achieved in the present invention by applying solid optical packaging techniques to the optical interfaces of a holographic memory system. Liquid crystal polarization rotators are used for intensity control and optical path switching, and novel liquid crystal gratings are employed for electro-optical beam steering, to eliminate moving mechanical components such as steering mirrors, thus providing a parallel, non-mechanical, read/write interconnection for angle-multiplexed three-dimensional (3-D) optical memories. In particular, the invention provides parallel optical interconnects that provide an interface between the optical-recording medium and the source and destination of the data (which is generally a computer or computer network) for a holographic, optical memory. The interfaces to the data source and data destination are electrical. The apparatus converts data, presented in an electrical format, to an optical format and encodes it in or decodes it from the optical-memory medium.

The preferred embodiment of the interconnection comprises a spatial light modulator, a pixelized readout device (i.e., focal-plane array), a series of polarizing optical components, liquid-crystal polarization rotators, liquid-crystal beam-steering devices, and interconnecting and imaging optics. The parallel interconnection accepts a laser-beam input, divides the beam among multiple paths, imparts a data-bearing spatial signature on a signal beam by means of a spatial light modulator, steers a reference beam by means of liquid-crystal beam-steering devices, and directs the appropriate beams into the recording medium. Two point of novelty of the interconnection are 1) The interconnection functions that provide the input to the recording medium are realized within a solid-optical assembly requiring no air-glass interfaces, and 2) the beam-steering functions for the reference beam are accomplished by non-mechanical means using liquid-crystal devices.

Alternative embodiments of the invention are realized through a variety of ways in which the optical paths can be directed within the assembly (i.e., the number of optical paths, the direction of the optical paths, etc.). The apparatus can also accommodate transmissive spatial light modulators and reflective spatial light modulators. The realization of the interconnection takes on a different form based on the type of the spatial light modulator. Also, the interconnection is not limited to a particular spatial-light modulator technology. It may be applied for spatial light modulators using any liquid-crystal material, micro-electromechanical devices, to magneto-optic devices, or any other technology that preserves the spatial coherence of an input laser beam while modulating its intensity in a controllable spatial pattern.

DETAILED DESCRIPTION OF THE PREFERRED EMBODIMENTS

The present invention relates generally to improvements in interface apparatus and methods for three dimensional optical memories. In a preferred embodiment, the invention provides a parallel, non-mechanical, read/write interconnection for angle-multiplexed three-dimensional (3-D) optical memories. Current dynamic data-memory technologies encode binary data onto two-dimensional electromagnetic media (i.e, magnetic tape, magnetic discs, etc.) These media undergo a localized change in some measurable property as a means of encoding the binary data. By measuring the state of the two-dimensional medium at a particular location, a "bit" of data is recovered. By contrast, three-dimensional holographic, optical memories simultaneously encode large amounts of information (generally referred to as a "page"). The information is stored in a three-dimensional recording medium, and multiple pages are physically superimposed through holographic means within the same volume of the memory medium.

Because of the dramatic differences between conventional memories and holographic memories, the inventors have found that new means for encoding and decoding pages of memory within the recording medium are needed. The present invention provides apparatus and methods that integrate data encoding and decoding functions into a compact optical assembly with electrical interfaces.

Figure 2:
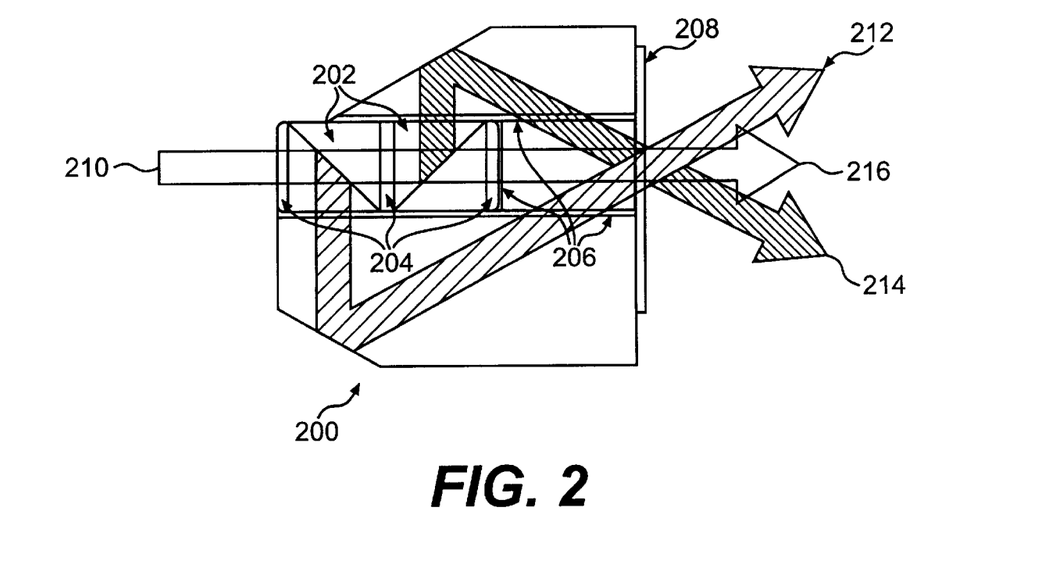
FIG. 2 is a schematic diagram of a prototypical holographic memory system according to the present invention, incorporating a first embodiment of the solid optical interconnection structure of the invention.

FIG. 2 is a schematic diagram of a basic prototypical holographic memory system 200 according to the present invention, incorporating a first embodiment of the solid optical interconnection structure of the invention. System 200 demonstrates the advantages of solid-optical packaging as well as the usefulness of liquid-crystal devices for this application. The prototype provides a compact, efficient optical interconnect with relaxed alignment tolerances.

System 200 provides two paths leading to different angles in a holographic memory. As shown in FIG. 2, system 200 comprises beamsplitters 202, liquid crystal cells 204, polarizers 206, and holographic memory plate 208. In operation, the liquid crystal cells are actuated to selectively polarize input beam 210 and transmit a portion of beam 210 as first reference beam 212 or second reference beam 214. The output of the holographic memory as a result of applying the first or second reference beams is signal beam 216, representing an image stored in the memory at an angle associated with either first reference beam 212 or second reference beam 214.

The assembled system 200 as shown in FIG. 2 measures 8.9 cm×3.8 cm and has a 1 cm² optical aperture. The device's assembly is straightforward; beamsplitters 202, liquid-crystal cells 204, and polarizers 206 are connected as solid optical pathways using a combination of optical gel and index-matching fluid. Once placed in its housing, the system is easily transported and rarely requires realignment.

In experimental use, this system successfully recorded two angularly multiplexed holograms within a thin-film silver-halide emulsion. In operation, as shown in FIG. 2, reference and signal beams are separated and attenuated using a combination of liquid-crystal cells 204, polarizing beamsplitters 202 and sheet polarizers 206. Depending on the state of the liquid-crystal cells 204, one of two reference beams will be generated: first reference beam 212 or second reference beam 214. First reference beam 212 strikes the holographic plate at a −30° angle of incidence, while second reference beam 214 has a +30° angle of incidence. By switching between these two reference beams, one can select an individual holographic memory image location for recording or readout.

Figure 3:
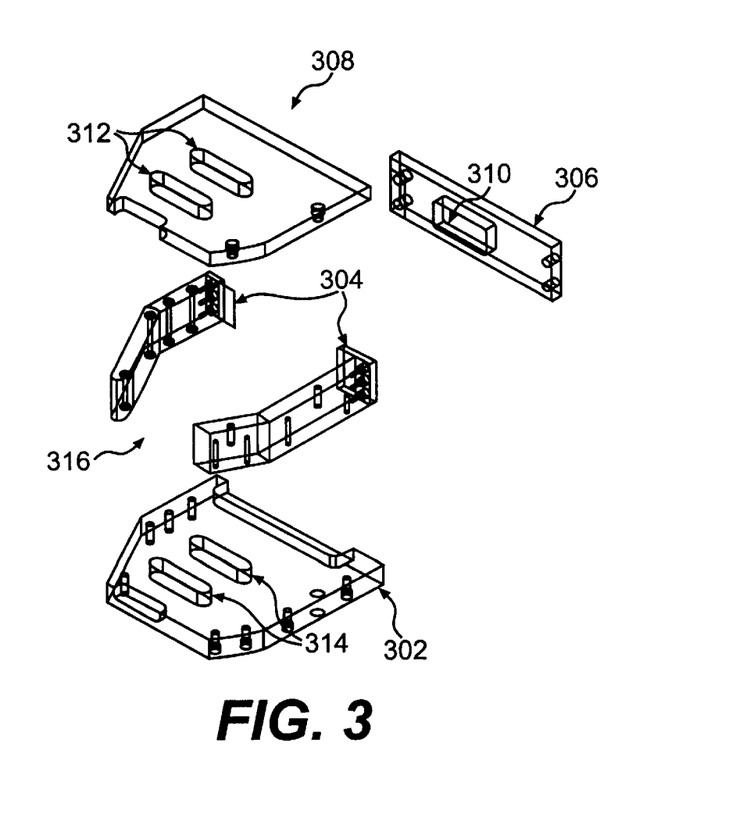
FIG. 3 is an assembly diagram illustrating a housing of the holographic memory system of FIG. 2.

FIG. 3 is an assembly diagram showing a housing of the holographic memory system of FIG. 2. Preferably, the apparatus shown in FIG. 2 is mounted in the housing so that the input port of the housing and the output port of the housing are aligned with the input and output of the holographic memory system, respectively. The housing incorporates aluminum base plate 302, black Delrin (TM) side plates 304, black Delrin face plate 306, and clear lexan top plate 308. Plate 306 has an optical output port 310. Top plate 308 has two electrical ports 312 for making electrical connections to the electro-optical liquid crystal devices. Base plate 302 has similar electrical ports 314. An optical input port 316 is located opposite output port 310.

Figure 4:
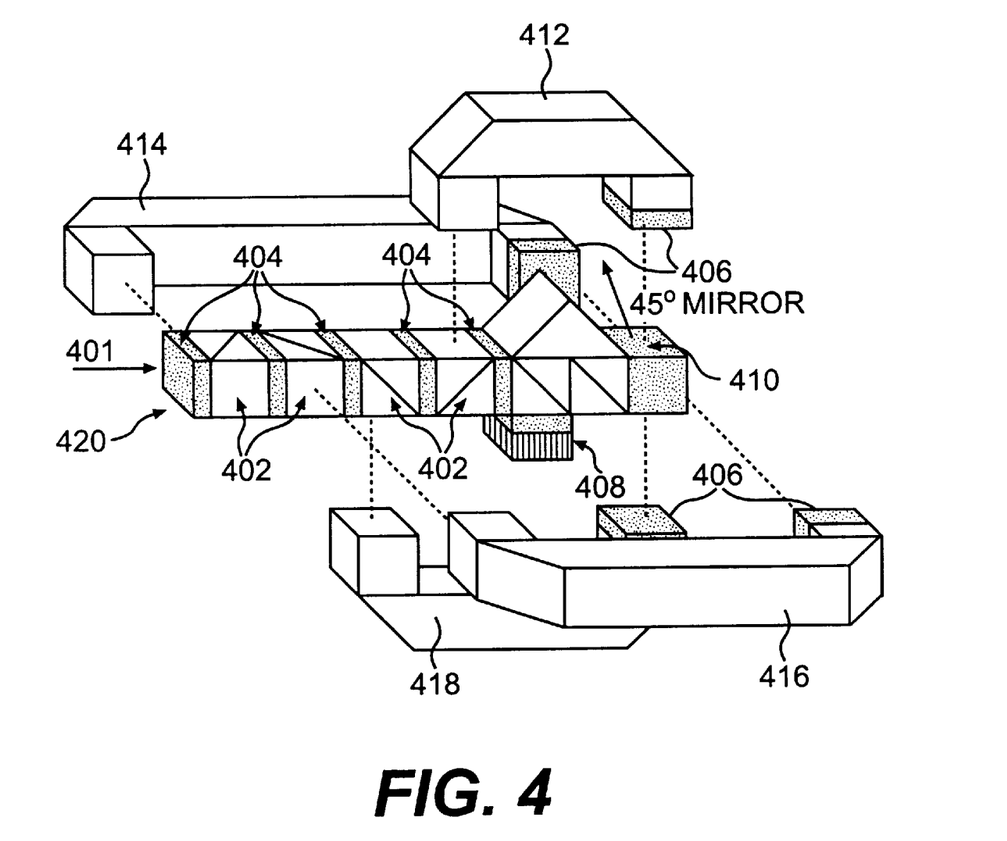
FIG. 4 is an assembly diagram illustrating a second preferred embodiment of the interconnection structure according to the invention, which provides a greater number of possible signal paths than the structure of FIG. 2.

FIG. 4 is an assembly diagram showing a second preferred embodiment of the interconnection structure according to the invention, which provides a greater number of possible signal paths than the structure of FIG. 2. The embodiment of FIG. 4 uses a separate beam-steering mechanism for each of the four reference-beam orientations. The packaging approach for the front-end of the interconnection (i.e. everything but the read out) is illustrated in FIG. 4. This embodiment has a 90° separation between the signal beam and the reference beam. This choice maximizes the number of angularly multiplexed holograms that can be stored in a single location. Incoming laser beam 401 is directed along a linear path towards the recording medium 410. A series of polarizing beamsplitter cubes 402 with preceding liquid crystal polarization rotators 404 create optical switches which may direct the laser beam or an appropriate portion of it, to one of the four reference-beam paths. The reference-beam paths are the four U-shaped paths 412, 414, 416, and 418 which lie on each of the four sides of central signal path 420. The four reference paths realize an effective, four-fold peristrophic multiplexing scheme; that is, the system is equivalent to one with a single reference beam in which the recording medium is mechanically rotated by 90° along an axis through the center of the system.

The polarization rotators used may be, for example, a "932 Liquid-Crystal Light Control System" manufactured by Newport Corporation, Irvine, Calif., or any of the Liquid-Crystal Variable Retarders (part numbers LVR-100, LVR-200, LVR-300), available from Meadowlark Optics, Longmont, Colo.

An example of a suitable liquid-crystal SLM 408 the ChronoColor Display by Displaytech of Longmont, Colo. If a non-liquid crystal element is desired, the Digital Light Processing (DLP) Systems manufactured by Texas Instruments may be used.

At the end of each reference-beam path is a liquid-crystal beam-steering device 406. Devices 406 can provide steering of approximately ±10° with a resolution of 0.01°. The signal beam passes straight through the four beamsplitter cubes, and the final polarization rotator in the forward path adjusts the beam's polarization so it is reflected at the final beamsplitter down onto the reflective SLM.

If SLM 408 is a liquid-crystal device (such as a ferroelectric SLM), a polarization rotator is not needed before the spatial light modulator. In this case, the SLM is designed so that the polarization of the light striking the "on" pixels is rotated by 90°. This light, after reflection from the SLM, passes through the beamsplitter cube, through the right-angle prism and 45° mirror, and into the recording medium. Unrotated light from the "off" pixels is reflected at the beamsplitter and directed away from the recording medium. The system can also be realized using a transmissive SLM, or a non-polarizing SLM (either transmissive or reflective).

If the SLM selected is a non-polarizing device, such as digital micro-mirrors (DMM's), the polarization rotator before the SLM performs the function of rotating the signal beam's polarization. The polarization rotator operates on the whole beam, and the SLM modulates the amplitude of individual pixels by adjusting the angular positions of the micromirrors.

The four different reference may have different polarization directions. In FIG. 4, light in lateral reference paths 414 and 416 may be polarized vertically, and light in top and bottom paths 412 and 418 may be polarized horizontally. In order for the signal and reference beams to interfere and produce a hologram, their polarizations must be parallel. Therefore, a final polarization rotator may be used in the signal path, just before the recording medium, to adjust the signal beam's polarization.

Figure 5:
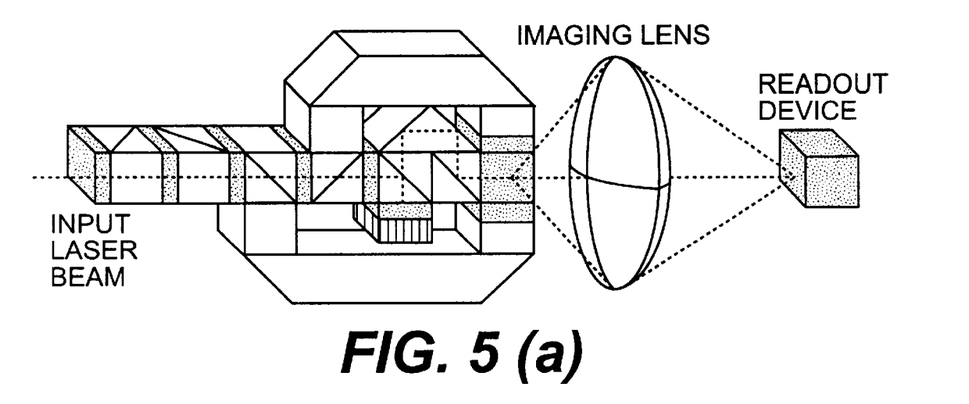
FIGS. 5a, 5b, and 5c are exemplary illustrations of several of the plural signal paths functioning in the interconnection structure of FIG. 4.

The optical interconnection of this embodiment is illustrated in FIGS. 5a, 5b, and 5c. FIG. 5a shows the signal path. FIGS. 5b and 5c show two of the four available reference paths (the others are omitted for clarity, as is the depiction of the solid optic portions 414 and 416 carrying those paths).

In this first embodiment, a separate beam-steering mechanism is used for each of the four reference-beam orientations because the reference beams and signal beam share a common optical path for much of the physical assembly.

Figure 6:
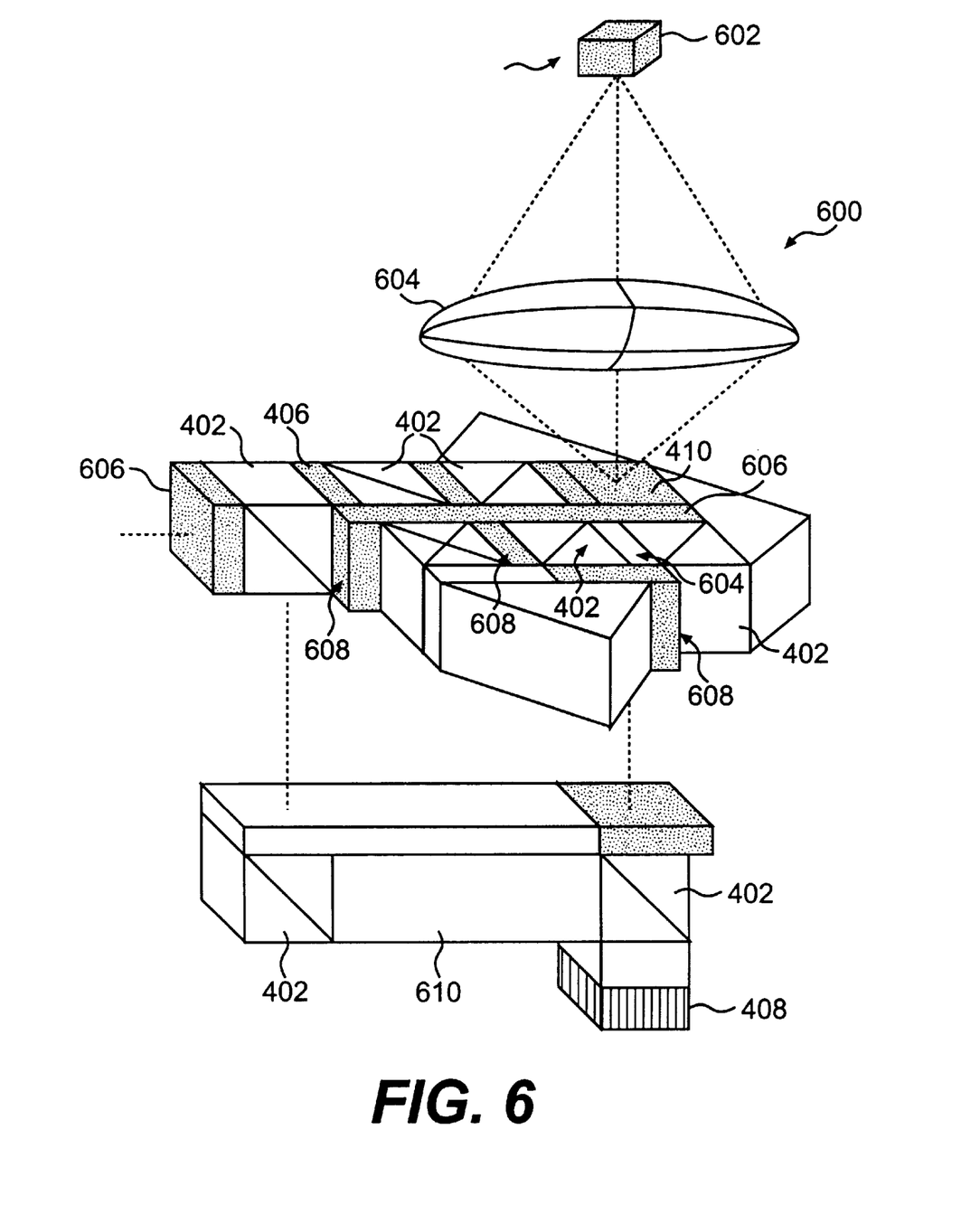
FIG. 6 is an assembly diagram illustrating another preferred embodiment of the inventive interconnecting structure which uses a single beam steering mechanism for plural reference positions.
Figure 7:
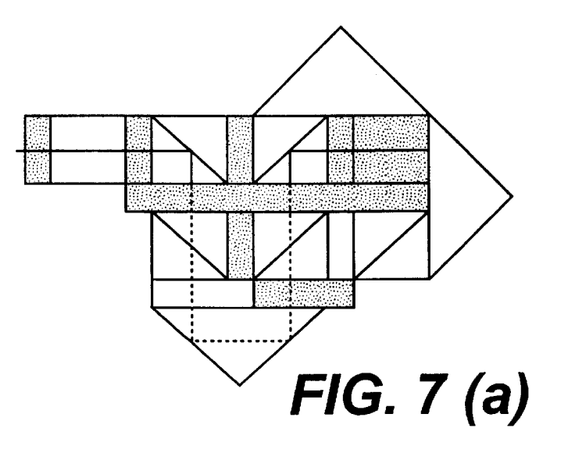
FIGS. 7a–7d are schematic diagrams illustrating four signal paths functioning in the interconnection structure of FIG. 6.

In an alternative preferred embodiment of the invention, the reference beam is separated from the signal path at the first optical switch. The structure incorporates a single beam-steering device 406 prior to separation into the different reference-beam paths. FIG. 6 is an assembly diagram showing this second embodiment as a system 600 including a separated solid model. This embodiment also uses a 90° separation between the signal beam and the reference beams, and it implements four-fold peristrophic multiplexing in the same manner as the first embodiment illustrated in FIG. 2. As shown in FIG. 6, system 600 incorporates polarizing beamsplitters 402, recording medium 410, imaging lens 604, high speed parallel read out (CCD) 602, liquid crystal beam steerer 406, fixed polarization rotators 606, and liquid crystal polarization rotators 608. A solid optic signal path 610 connects the other components to complete the signal path.

FIGS. 7*a*–7*d* illustrate the four reference beam paths for the embodiment of FIG. 6. Solid lines for the optical paths indicate the s-polarization state (i.e. transverse electric polarization) and the dashed line indicates the p-polarization state (i.e. transverse magnetic polarization). The beamsplitters reflect s polarization and transmit p polarization.

Figure 8:
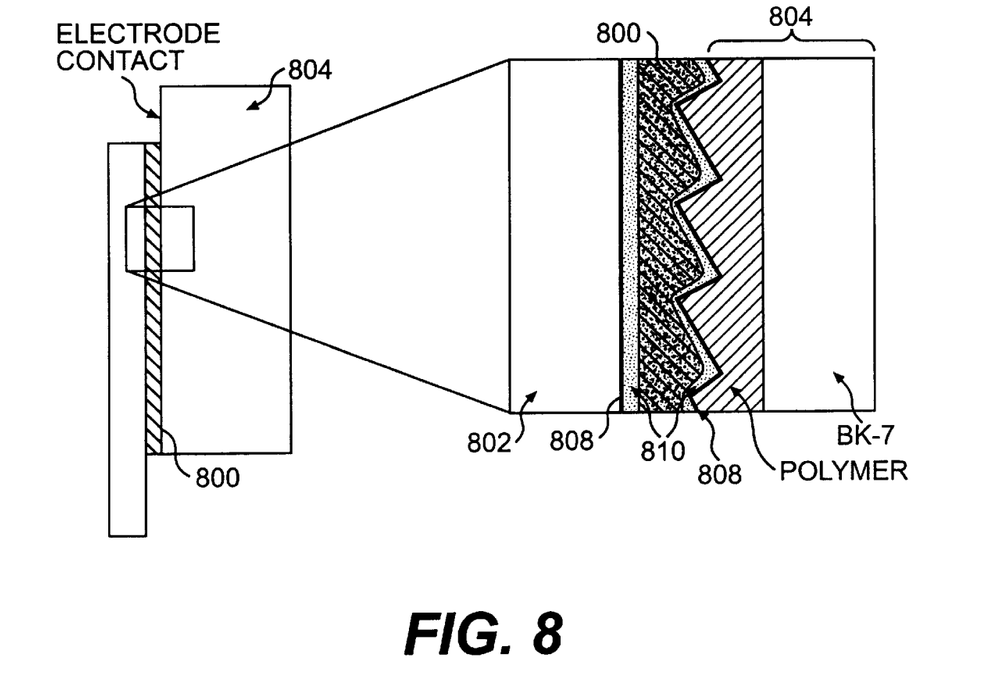
FIG. 8 is a side view of a liquid crystal grating device made according to the process of the present invention.

The novel liquid-crystal grating device and manufacturing method of the invention will now be described with reference to FIG. 8. FIG. 8 is a side view of a liquid crystal grating device made according to the process of the present invention.

As mentioned above, liquid-crystal gratings, while known in theory to those actively researching liquid-crystal devices, are not readily available. The present invention demonstrates the feasibility of making such devices using specialized fabrication techniques. As shown in FIG. 8, a 20 $\mu$m layer 800 of liquid-crystal material is sandwiched between a flat, glass substrate 802 and a glass substrate 804 with a blazed grating surface 806 formed from a polymer applied to the substrate. Both substrates 802 and 804 are coated with a conductive indium-tin-oxide (ITO) layer 808 and a polyimide alignment layer 810. The device steers light from one discrete angle to the next when a voltage is applied to ITO layers 808, thereby changing the effective index of liquid crystal layer 800. Proper tuning of this index increases the diffraction efficiency of one grating order while simultaneously decreasing the efficiency of all other orders.

In the course of fabricating the device, several challenges related to the nature of the grating must be overcome. Blazed gratings are molded into the relatively soft, brittle polymer resin. Pressure can deform the grating relief structure, and high temperatures ($\geq$120° C.) can make the resin brown or opaque. A specific fabrication procedure was developed by the inventors to avoid these potential problems.

In particular, the ITO coating process should be performed at room temperature, with operating parameters that will not burn the blazed grating resin. An otherwise conventional sputtering process is preferred over CVD or other processes for forming film layers. The thickness of the ITO layer should be optimized so that it is thick enough to form a continuous, conductive coating across the relief structure, but not so thick that it fills in the grooves of the grating blaze.

To control the thickness of the ITO layer, the duration of the sputtering operation (i.e., time in chamber for grating) may be varied. The appropriate time in chamber can easily be determined experimentally for a particular combination of equipment, grating, and other sputtering process parameters. As noted above, the objective is to provide a continuous coating without filling in the grooves of the grating blaze. Therefore, to determine the appropriate duration of sputtering, it is possible to begin with a short sputtering duration and observe whether a minimal continuous coating is produced. If not, the duration is gradually increased in subsequent trials while maintaining all other process parameters constant, until the coating objectives are satisfied.

Finally, the surface treating process selected must preserve the grating relief structure. Typical surface treatment involves buffing an alignment layer. This layer causes liquid-crystal molecules near the surface to align in a particular direction and behave uniformly across the liquid crystal cell's aperture. Preferably, both the grating and flat glass substrates are surface treated to enhance uniform transmission across their apertures, but the treating is performed gently on the grating substrate so as not to degrade the grating structure.

Figure 9:
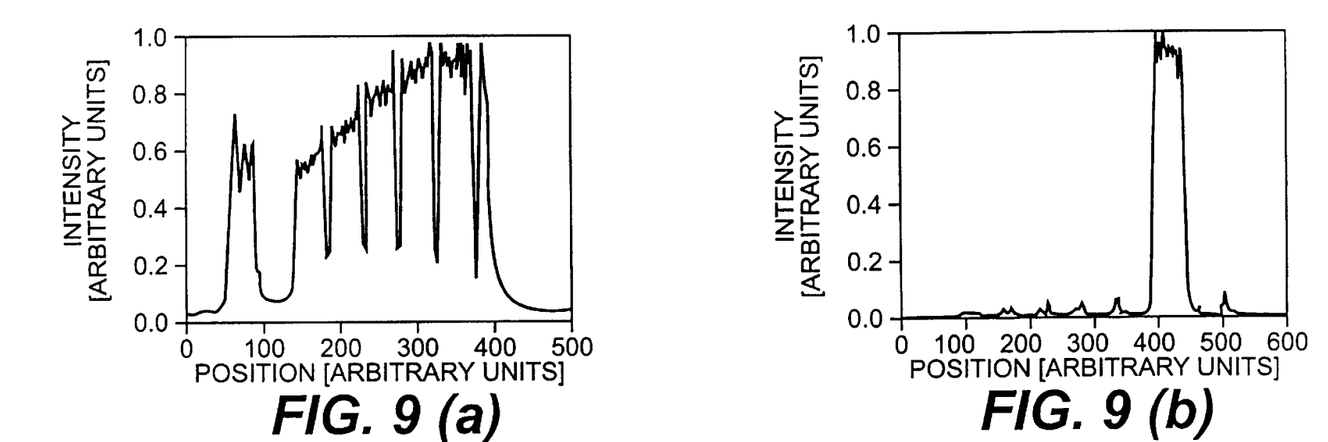
FIGS. 9a and 9b are graphs illustrating intensity cross sections for original output of the prototype spatial light modulator of the invention for two experimentally recorded patterns.
Figure 10:
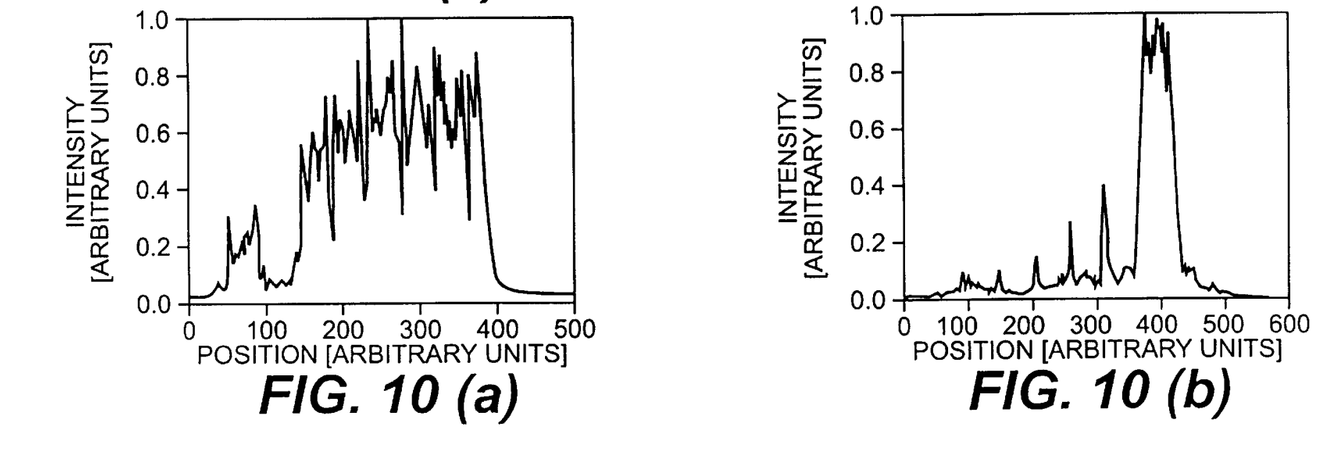
FIGS. 10a and 10b are graphs illustrating intensity cross sections for a holographic reproduction of the recorded patterns corresponding to FIGS. 9a and 9b, respectively.

FIGS. 9 and 10 illustrate the performance of the prototype unit shown in FIGS. 2 and 3. To demonstrate the system's operation, the inventors recorded two holographic patterns—one recorded with each of the two reference beams. Intensity cross sections of the two patterns as stored in the holographic memory, registered using a 1024-element linear detector array, are shown in FIGS. 9*a* and 9*b*. Intensity patterns of corresponding holographic reconstructions (readout of stored data) are shown in FIGS. 10*a* and 10*b* respectively.

The intensity cross section of FIG. 9*a* reflects the recorded intensity of a pattern of ten parallel vertical pixels. Nine of the pixels are in the "on" state (i.e., light transmitting) with one pixel in the "off" state (i.e., light blocking). The second pattern (FIG. 9*b*) was made up of an inverse configuration: a single bright pixel with nine black pixels. During a switch between the two patterns, two of the pixels do not change while the rest switch states.

As can be seen, the reconstructions reflect some degradation of the original pattern, but the signal-to-noise ratio remains high and a high level of correlation is obtained between data stored and data read out of the memory using the interface provided by the present invention.

It will be understood that although the invention has been disclosed with reference to a prototype demonstration embodiment and two preferred embodiments, these embodiments are merely exemplary. The number of different switchable paths provided in a device according to the present invention is variable at the option of the artisan, depending on the amount of storage space required. Those skilled in the art will recognize that a variety of configurations and geometries may be provided depending on the requirements of the particular application.

The present invention has numerous significant applications. Holographic storage is particularly useful in special-purpose systems requiring very high density storage, and especially for data that lend themselves to page-oriented storage, such as real-time video or graphics. As the systems become more mature, holographic storage may compete with conventional storage technologies for commercial applications, including computer-network storage, personal-computer storage, and archiving. The systems disclosed in the present invention may be miniaturized so as to store a huge amount of information in a crystal the size of a sugar cube. Holographic storage may find applications in satellite communications, airborne reconnaissance, high-speed digital libraries, rugged storage for tactical vehicles, and image processing for medical, video, and military purposes.

The invention provides a number of significant advantages relative to prior art systems. First, the present invention provides an effective system at lower cost. By eliminating many of the air-glass interfaces, fewer optical coatings are required for the optical elements, reducing expense. In addition, interior optical surfaces that are connected by means if index-matching adhesives can be manufactured to relaxed surface-quality standards. By contrast, stringent surface-quality requirements are imposed on surfaces at air-glass boundaries. These stricter tolerances increase manufacturing costs substantially.

Because of the ability to electro-optically alter the beam properties within the solid-optical assembly, the assembly can be manufactured using relaxed mechanical tolerances, and residual alignment errors can be corrected using the liquid-crystal devices, thus improving manufacturability. The liquid-crystal devices used in the present invention also have more convenient electrical interfaces than mechanical beam-steering components. They are also available at lower cost and have higher reliability.

Integrating optical functions using the solid-optical approach of the present invention yields a significant reduction in the overall package size. Reduction in package size very important for an application like computer memory where size standards have been set by existing memory technologies. Conventional optical interconnections for holographic memories result in very large and heavy systems that would be unacceptable when compared to existing systems. The solid-optical approach yields a package that is vary similar in size to existing memory systems with much higher performance.

Thus, the present invention provides improved systems and methods for constructing, manufacturing, and operating holographic memory devices. The invention is not limited to the specific embodiments disclosed in the specification, and may include various embodiments limited only by the scope of the appended claims.

We claim:

1. An optical memory system comprising:

input means for receiving light encoded with data;

holographic storage means coupled to said input means for receiving and storing said light encoded with data in a multiplexed three dimensional optical memory at one of a plurality of defined angles, and outputting said light encoded with data as light output;

output means coupled to the holographic storage means for receiving said light encoded with data and passing said light encoded with data to an external device;

a plurality of optical paths, each associated with at least one of said plurality of defined angles of the holographic storage means, and each coupling said input means to said holographic storage means;

electrically controlled non-moving optical switching means coupled to said plurality of optical paths for selecting and activating any one of said plurality of optical paths to pass light to said holographic storage means at the defined angle associated with that path for storing or retrieving data; and control means, coupled to said electrically controlled non-moving optical switching means for receiving an external input defining a desired holographic memory location, and for selectively activating said electrically controlled non-moving optical switching means to select one of said plurality of optical paths associated with said desired holographic memory location, wherein said electrically controlled non-moving optical switching means comprises at least one liquid crystal cell, selectively actuated to selectively polarize the light encoded with data and transmit portion of the light encoded with data through as a reference beam over a corresponding one of the plurality of optical paths.

2. The optical memory system of claim 1, wherein said plurality of optical paths further comprise interconnection elements optically interconnecting said input means with said holographic storage means, wherein said interconnection elements comprise a solid-optical assembly having no air-glass interfaces.

3. An optical memory system comprising:

input means for receiving light encoded with data;

holographic storage means coupled to said input means for receiving and storing said light encoded with data in a multiplexed three dimensional optical memory at one of a plurality of defined angles, and outputting said light encoded with data as light output;

output means coupled to the holographic storage means for receiving said light encoded with data and passing said light encoded with data to an external device;

a plurality of optical paths, each associated with at least one of said plurality of defined angles of the holographic storage means, and each coupling said input means to said holographic storage means;

electrically controlled non-moving optical switching means coupled to said plurality of optical paths for selecting and activating any one of said plurality of optical paths to pass light to said holographic storage means at the defined angle associated with that path for storing or retrieving data; and control means, coupled to said electrically controlled non-moving optical switching means for receiving an external input defining a desired holographic memory location, and for selectively activating said electrically controlled non-moving optical switching means to select one of said plurality of optical paths associated with said desired holographic memory location, wherein said electronically controllable non-moving optical switching means comprises:

a polarizing beam-splitter cube; and a liquid crystal polarization rotator, coupled to the beam-splitter cube, wherein said liquid crystal polarization rotator may be selectively engagable to direct a light beam through the polarizing bean-splitter cube to a selected one of the plurality of optical paths.

4. An optical memory system comprising:

input means for receiving light encoded with data;

holographic storage means coupled to said input means for receiving and storing said light encoded with data in a multiplexed three dimensional optical memory at one of a plurality of defined angles, and outputting said light encoded with data as light output;

output means coupled to the holographic storage means for receiving said light encoded with data and passing said light encoded with data to an external device;

a plurality of optical paths, each associated with at least one of said plurality of defined angles of the holographic storage means, and each coupling said input means to said holographic storage means;

electrically controlled non-moving optical switching means coupled to said plurality of optical paths for selecting and activating any one of said plurality of optical paths to pass light to said holographic storage means at the defined angle associated with that path for storing or retrieving data; and control means, coupled to said electrically controlled non-moving optical switching means for receiving an external input defining a desired holographic memory location, and for selectively activating said electrically controlled non-moving optical switching means to select one of said plurality of optical paths associated with said desired holographic memory location, wherein said plurality of optical paths further comprise interconnection elements optically interconnecting said input means with said holographic storage means, wherein said interconnection elements comprise a solid-optical assembly having no air-glass interfaces.

5. An optical memory system comprising:

at least one electrically controlled non-moving optical switching means for selectively diverting at least a portion of an input light beam as a reference beam;

a holographic recording medium, coupled to said at least one electrically controlled non-moving optical switching means, for receiving another portion of the input beam as a signal beam;

at least one reference beam path, coupled to the at least one electrically controlled non-moving optical switching means and the holographic recording medium, each of the at least one reference beam path diverting a corresponding reference beam to the holographic recording medium at a corresponding fixed predetermined angle; and interconnection elements optically interconnecting said at least one electrically controlled non-moving, optical switching means, said spatial light modulator, and said holographic recording medium, wherein said interconnection elements comprise at least one solid-optical assembly having no air-glass interfaces.

6. An optical memory system comprising:

at least one electrically controlled non-moving optical switching means for selectively diverting at least a portion of an input light beam as a reference beam;

a holographic recording medium coupled to said at least one electrically controlled non-moving optical switching means, for receiving another portion of the input beam as a signal beam;

at least one reference beam path, coupled to the at least one electrically controlled non-moving optical switching means and the holographic recording medium, each of the at least one reference beam path diverting a corresponding reference beam to the holographic recording medium at a corresponding fixed predetermined angle;

a spatial light modulator, coupled to the at least one electrically controlled non-moving optical switching means and the holographic recording medium, for receiving the signal beam and imparting a data-bearing spatial signature on a signal beam, and for passing the signal beam imparted as with a data-bearing spatial signature to the holographic recording medium; and interconnection elements optically interconnecting said at least one electrically controlled non-moving optical switching means, said spatial light modulator, and said holographic recording medium, wherein said interconnection elements comprise at least one solid-optical assemble having no air-glass interfaces.

7. An optical memory system comprising:

at least one electrically controlled non-moving optical switching means for selectively diverting at least a portion of an input light beam as a reference beam;

a holographic recording medium, coupled to said at least one electrically controlled non-moving optical switching means, for receiving another portion of the input beam as a signal beam; and at least one reference beam path, coupled to the at least one electrically controlled non-moving optical switching means and the holographic recording medium, each of the at least one reference beam path diverting a corresponding reference beam to the holographic recording medium at a corresponding fixed predetermined angle, wherein said at least one electrically controlled non-moving optical switching means comprises at least one liquid-crystal device.

8. The apparatus of claim 7, wherein the spatial light modulator comprises a transmissive spatial light modulator.

9. The apparatus of claim 8, wherein the spatial light modulator comprises a reflective spatial light modulator.

10. A method of storing data in an optical memory system comprising:

selectively diverting at least a portion of an input light beam as a reference beam using at least one electrically controlled non-moving optical switch, receiving, in a holographic recording medium coupled to the at least one electrically controlled non-moving optical switch, another portion of the input light beam as a signal beam, and diverting, using at least one reference beam path coupled to the at least one electrically controlled non-moving optical switch and the holographic recording medium, a corresponding reference beam to the holographic recording medium at a corresponding fixed predetermined angle, wherein said using at least one electrically controlled non-moving optical switch comprising at least one group of steps of:

(1) selectively actuating at least one liquid crystal device to selectively polarize said portion of the input light beam and to transmit said portion of the light beam through as a reference beam over a corresponding one of a plurality of optical paths;

(2) using a polarizing beam-splitter cube; and
using a liquid crystal polarization rotator coupled to the beam-splitter cube,
wherein said liquid crystal polarization rotator may be selectively engagable to direct a light beam through the polarizing beam-splitter cube to a selected one of a plurality of optical paths;

(3) optically interconnecting said electrically controlled non-moving optical switch with said holographic recording medium with at least one solid-optical assembly having no air-glass interfaces.

11. The method of claim 10, further comprising the step of:

receiving the signal beam in a spatial light modulator coupled to the at least one electrically controlled non-moving optical switch and the holographic recording medium, imparting a data-bearing spatial signature on a signal beam with the spatial light modulator, and passing the signal beam imparted with a data-bearing spatial signature to the holographic recording medium.

* * * * *